(12) United States Patent
Bin Abdul Aziz et al.

(10) Patent No.: US 11,569,152 B2
(45) Date of Patent: Jan. 31, 2023

(54) ELECTRONIC DEVICE WITH LEAD PITCH GAP

(71) Applicant: Texas Instruments Incorporated, Dallas, TX (US)

(72) Inventors: Anis Fauzi Bin Abdul Aziz, Kedah (MY); Lee Han Meng@Eugene Lee, Malacca (MY); Wei Fen Sueann Lim, Melaka (MY); Siew Kee Lee, Kedah (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 371 days.

(21) Appl. No.: 16/254,853

(22) Filed: Jan. 23, 2019

(65) Prior Publication Data
US 2020/0235042 A1    Jul. 23, 2020

(51) Int. Cl.
*H01L 23/495*    (2006.01)
*H01L 21/56*    (2006.01)
*H01L 23/31*    (2006.01)

(52) U.S. Cl.
CPC ........ *H01L 23/49541* (2013.01); *H01L 21/56* (2013.01); *H01L 23/3107* (2013.01); *H01L 23/4952* (2013.01)

(58) Field of Classification Search
CPC ........... H01L 23/495–49596; H01L 23/49861; H01L 21/4821–4842; H01L 23/49541–49565; H01L 23/49838–49844; H01L 23/49548; H01L 21/56; H01L 23/3107; H01L 23/4952; H01L 21/561; H01L 23/49555; H01L 2224/48091; H01L 2224/48247; H01L 21/4842
See application file for complete search history.

(56) References Cited

U.S. PATENT DOCUMENTS

| | | | |
|---|---|---|---|
| 5,271,148 A | | 12/1993 | Desrochers et al. |
| 5,455,446 A | * | 10/1995 | Suppelsa ........... H01L 23/49548 257/467 |
| 5,662,822 A | | 9/1997 | Tada et al. |
| 5,843,809 A | * | 12/1998 | Rostoker ............. H01L 23/4951 438/123 |
| 5,942,178 A | | 8/1999 | Frechette et al. |

(Continued)

*Primary Examiner* — Steven B Gauthier
*Assistant Examiner* — Khatib A Rahman
(74) *Attorney, Agent, or Firm* — Ronald O. Neerings; Frank D. Cimino

(57) ABSTRACT

An electronic device, a lead frame, and a method, including providing a lead frame with a Y-shaped feature having branch portions connected to a dam bar in a prospective gap in an equally spaced repeating lead pitch pattern, and a set of first leads extending parallel to one another along a first direction and spaced apart from one another along a second direction in lead locations of the repeating lead pitch pattern, attaching a semiconductor die to a die attach pad of the lead frame, attaching bond wires between bond pads of the semiconductor die, and the first leads, enclosing first portions of the first leads, the die attach pad, and a portion of the semiconductor die in a package structure, and performing a dam bar cut process that cuts through portions of the dam bar between the lead locations of the repeating lead pitch pattern.

19 Claims, 12 Drawing Sheets

(56) References Cited

U.S. PATENT DOCUMENTS

| | | | | |
|---|---|---|---|---|
| 6,177,718 | B1* | 1/2001 | Kozono | H01L 21/565 |
| | | | | 257/666 |
| 2006/0197207 | A1* | 9/2006 | Chow | H01L 23/3135 |
| | | | | 257/686 |
| 2006/0220191 | A1* | 10/2006 | Sundstrom | H01L 23/49541 |
| | | | | 257/669 |
| 2014/0001620 | A1* | 1/2014 | Shimizu | H01L 23/49551 |
| | | | | 257/676 |
| 2014/0327122 | A1* | 11/2014 | Jeon | H01L 24/97 |
| | | | | 257/670 |
| 2015/0144389 | A1 | 5/2015 | Lee et al. | |
| 2016/0293452 | A1* | 10/2016 | Ikura | H01L 23/49541 |
| 2018/0040540 | A1* | 2/2018 | Kasuya | H02P 6/12 |
| 2019/0229044 | A1* | 7/2019 | Saiyajitara | H01L 23/49582 |

* cited by examiner

ELECTRONIC DEVICE WITH LEAD PITCH GAP

BACKGROUND

Many integrated circuits and other electronic devices include equally spaced rows of pins or leads extending out of one or more sides of a package. Integration of magnetic components allows high levels of isolation between different circuits in a single package. For example, isolated DC-DC converter circuits can include primary circuitry such as one or more switching transistors, driver circuits, and a transformer primary winding, along with isolated secondary circuitry that includes rectifier diodes and a transformer secondary winding. In some examples, a first circuit is provided on a first die, a laminated magnetic structure provides transformer isolation between the first circuit and a second circuit on a second die. The first and second dies and the laminated magnetic structure can be integrated within a single electronic device package with associated pins or leads. Electronic devices that include multiple isolated circuits are often subject to lead-to-lead clearance requirements, for example, to ensure minimum spacing between leads of two isolated circuits within the device. Alternatively, or in addition, specific device architectures may call for spacing requirements between certain die attach pads and leads of the device. At the same time, electronic device packaging typically includes external leads in one or more rows along an associated side of the device package, with equal spacing between the leads, referred to as a repeating lead pitch pattern of uniform spacing or pitch. One or more leads may be omitted from the equally spaced lead pitch pattern where the standardized lead spacing is closer than the spacing requirements for a given circuit configuration in a device. However, new customized lead pitch designs are costly in terms of manufacturing time and tooling. For example, trim and form tooling is used to remove dam bar features from lead frames after molding, prior to lead trimming and lead shape formation. For uniform lead pitch patterns, standard dam bar cutting tools (e.g., punch and die systems) cut the dam bar material between the uniformly spaced leads, leaving the prospective lead material in place for subsequent trimming and forming. Simply removing one or more pins from the repeating lead pitch pattern would result in extra debris falling into the trim and form tooling, causing contamination and requiring additional tool cleaning operations. Alternatively, custom trim and form tooling can be designed and fabricated for each new custom lead frame design, but this is extremely expensive and causes delays in manufacturing.

SUMMARY

A described electronic device includes a lead frame, a semiconductor die, and a package structure. The lead frame includes first leads having first and second portions. The second portions extend parallel to one another along a first direction and are positioned in a repeating lead pitch pattern at lead locations equally spaced apart from one another along a second direction. The second portions of the first leads have a formed non-planar shape, such as a gull wing shape, a J lead shape, etc. The lead frame also includes a second lead with first and second portions. The second portion of the second lead is spaced apart from the second portions of the first leads in a gap in the repeating lead pitch pattern along the second direction. The second portion of the second lead is also spaced apart from the lead locations of the repeating lead pitch pattern along the second direction. The package structure encloses the first portions of the first and second leads, and further encloses at least a portion of the semiconductor die. The second portions of the first leads extend outward from the package structure, and the second portion of the second lead has an end that is exposed to an exterior of the package structure.

A described method includes providing a lead frame with a Y-shaped feature having branch portions connected to a dam bar in a prospective gap in an equally spaced repeating lead pitch pattern. The lead frame also includes a set of first leads extending parallel to one another along a first direction. The first leads are spaced apart from one another along a second direction in lead locations of the repeating lead pitch pattern. The method further includes enclosing first portions of the first leads, a die attach pad, and a portion of a semiconductor die in a package structure. The method also includes performing a dam bar cut process that cuts through portions of the dam bar between the lead locations of the repeating lead pitch pattern and performing a lead cut process that cuts ends of second portions of the first leads.

A described example lead frame includes a set of first leads, each including a first portion, and a second portion. The second portions extend parallel to one another along a first direction and are positioned in a repeating lead pitch pattern at lead locations equally spaced apart from one another along a second direction. The lead frame also includes a second lead with a first portion, a second portion, and a Y-shaped third portion. The second portion of the second lead is spaced apart from the second portions of the first leads in a gap in the repeating lead pitch pattern, and the second portion of the second lead is spaced apart from the lead locations of the repeating lead pitch pattern along the second direction.

DETAILED DESCRIPTION

Figure 1:
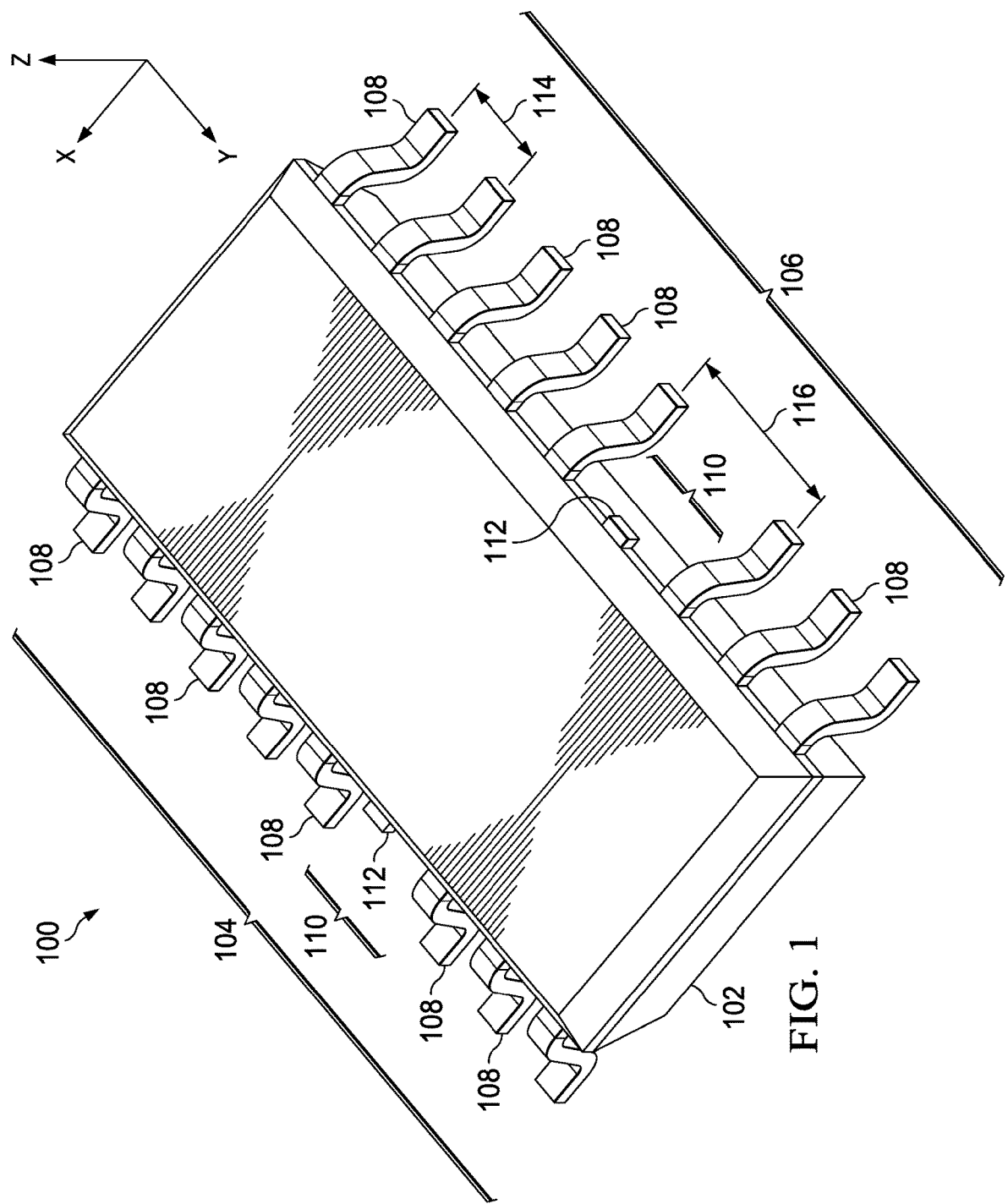
FIG. 1 is a top perspective view of an electronic device with a lead pitch pattern gap with two formed leads omitted from each side of a two-sided structure.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Described examples include electronic devices, lead frames, and product packaging methods. In one example, a lead frame includes a Y-shaped feature with branch portions connected to a dam bar in a prospective gap in an equally spaced repeating lead pitch pattern, which can be trimmed using standard trim and form tooling while providing a finished product with one or more lead spacing gaps to accommodate any desired lead spacing requirements without retooling. In one practical implementation, the Y-shaped feature can be included in a new lead frame design where there is a need for removal of an external lead, and the resulting device design can be manufactured using standard trim and form tooling that removes dam bar material in spaces between lead locations of a repeating lead pitch pattern.

FIG. 1 shows an integrated circuit electronic device 100 with a lead pitch pattern gap with two formed leads omitted from each side of a two-sided structure. The electronic device 100 includes a packaging structure 102, such as a plastic molded material that encloses an internal lead frame, one or more attached semiconductor dies, and associated bond wires (not shown in FIG. 1). The example electronic device 100 is an integrated circuit with pins or leads formed on opposite first and second sides 104 and 106, respectively. The electronic device 100 includes a set of first leads with internal first portions and externally extending second portions 108, some of which are formed on each of the first and second sides 104 and 106, respectively. In other examples, the device 100 can include leads with external second portions 108 on only a single side 104 or 106 of the package structure 102. In other implementations, the second portions 108 can be formed on more than two sides of the package structure 102. The second portions 108 of the first leads extend parallel to one another along a first direction, hereinafter the X direction, as shown in FIG. 1.

The externally extending second portions 108 of the first leads have a formed non-planar shape, in this example, a gull wing lead shape. The second portions 108 of the first leads are positioned in a repeating lead pitch pattern at lead locations equally spaced apart from one another along a second direction, hereinafter the Y direction as shown in FIG. 1. The X and Y directions in this example are perpendicular to one another and are each perpendicular to a vertical Z direction.

The example electronic device 100 in FIG. 1 includes gaps 110 in the repeating lead pitch pattern along the Y direction on each of the first and second sides 104 and 106, respectively. The electronic device 100 also includes a second lead with an internal first portion (not shown) and an externally exposed second portion 112. On each of the sides 104 and 106, the second portion 112 of the second lead is spaced apart from the second portions 108 of the first leads. In addition, the second portion 112 of the second lead on each side is spaced apart from the lead locations of the repeating lead pitch pattern along the Y direction. In the example of FIG. 1, the exposed second portions 108 of the first leads are spaced apart from one another along a repeating lead pitch pattern with a lead pitch or spacing distance 114 between adjacent lead positions. In the gaps 110, no first lead is provided, and the second portions 112 of the second leads within the gaps 110 are spaced apart from (i.e., not located at) the lead positions for which a first lead has been omitted.

The example gaps 110 in FIG. 1 extend between second portions 108 of the first leads adjacent to the gap 110, and there are two lead locations for which first leads have been omitted in this example, and the Y-direction spacing distance 116 between the first leads encompassing the gaps 110 is three times the lead pitch or spacing distance 114. The gaps 110 in this example provide a desired level of isolation spacing for a given internal circuit design, where the spacing 116 across the gaps 110 facilitates potentially high voltage isolation between separate circuits within the electronic device 100. Moreover, as discussed further below, the electronic device 100 is fabricated using a novel lead frame with Y-shaped features that allow the provision of the exposed second portions 112 of the second leads while mitigating or avoiding damage or degradation or contamination of trim and form tooling during manufacturing, and without requiring custom tooling for packaging operations in the fabrication of the electronic device 100.

Referring also to FIGS. 2-12, FIG. 2 shows a method 200, which can be employed in fabricating the electronic device 100 of FIG. 1 or other electronic devices in which a lead gap is desired for isolation or other reasons. FIGS. 3-11 illustrate the electronic device 100 of FIG. 1 undergoing fabrication processing generally according to the method 200 and illustrate a novel lead frame that facilitates cost-effective manufacturing using standard trimming and forming equipment. The method 200 begins in FIG. 2 with providing a lead frame with a Y-shaped feature having branch portions connected to a lead frame dam bar in a prospective gap in an equally spaced repeating lead pitch pattern.

Figure 3:
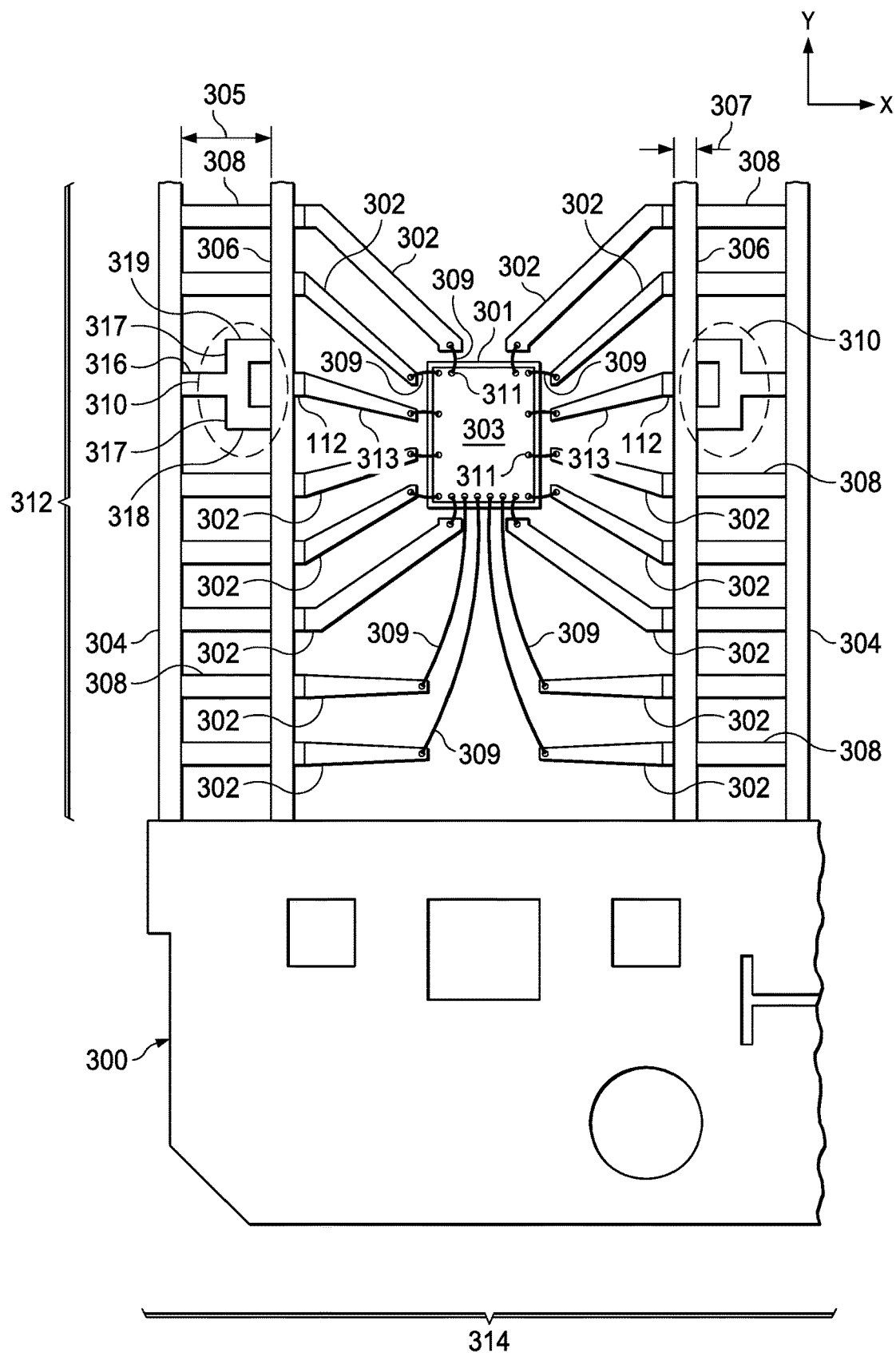
FIGS. 3 and 4 are partial top elevation views of a lead frame with first leads and a Y-shaped feature on each side of a two-sided structure after a semiconductor die is attached to a die pad and bond wires are soldered between the semiconductor die and first portions of the first leads.
Figure 4:
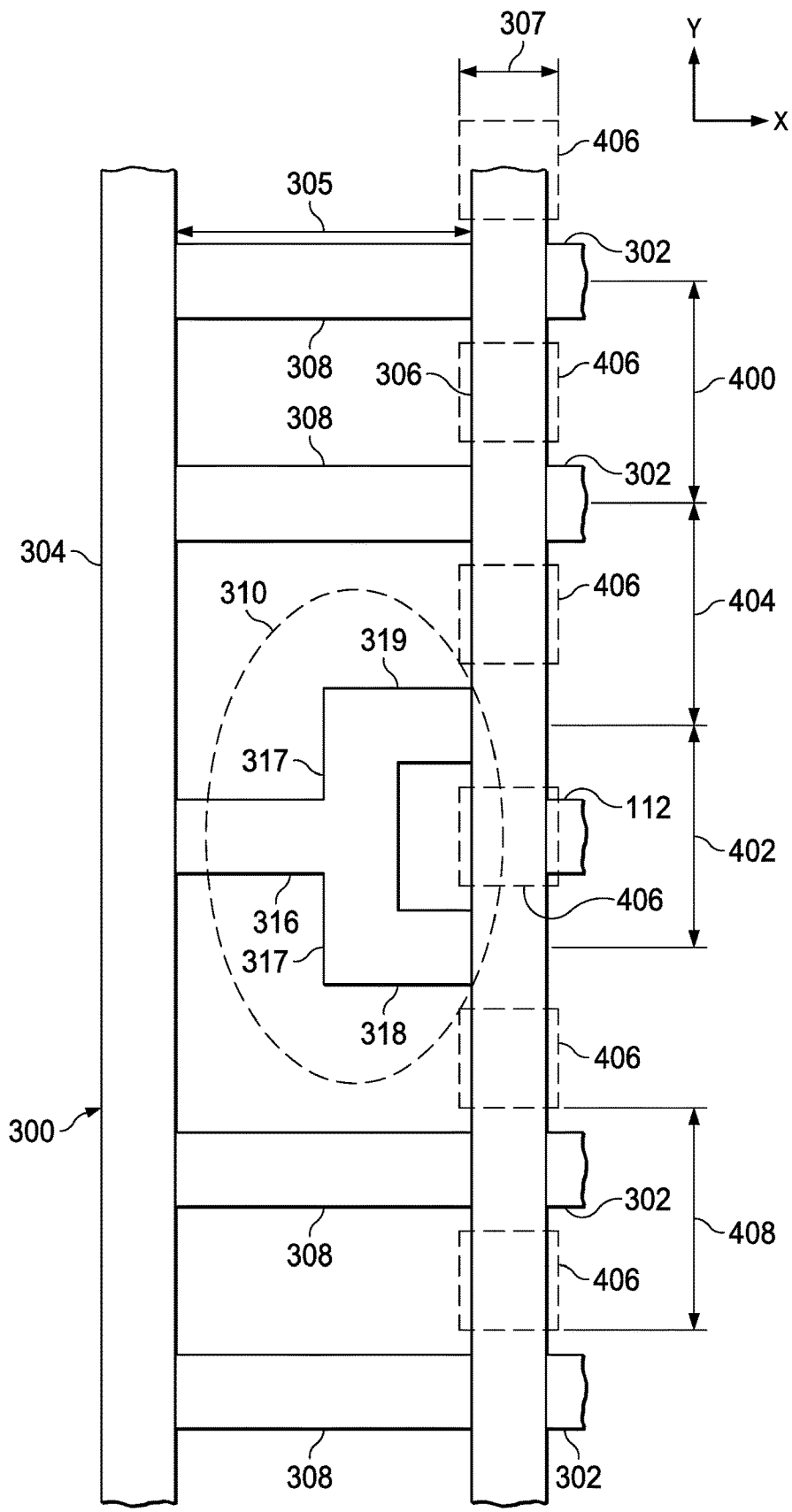

FIGS. 3 and 4 show partial top views of an example lead frame 300 with first leads and Y-shaped features on each side of a two-sided structure after a semiconductor die is attached to a die pad and bond wires are soldered between the semiconductor die and first portions of the first leads. Only portions of a starting lead frame 300 are shown in FIGS. 3 and 4. In one example, the lead frame 300 includes sections that respectively correspond to a corresponding finished electronic device, and multiple sections are processed concurrently. The lead frame 300 in one example is a copper structure formed by suitable stamping operations. The lead frame 300 includes one or more die attach pads 301. In the illustrated example, the illustrated section in FIG. 3 includes a single die attach pad 301. In one example, the lead frame 300 includes one or more support arms (not shown) that support the die attach pad 301. Such support arm or arms can be connected to portions of the lead frame to support the die attach pad 301 during and after manufacturing, or can be removed during manufacturing. In another example, the die attach pad 301 is supported relative to the lead frame 300 using an adhesive carrier or tape (not shown) to support the pad 301 and an attached semiconductor die during portions of the manufacturing process. Prior to external lead forming following packaging, the first leads are generally planar as shown in FIGS. 3 and 4. The first leads in the original lead frame 300 include first portions 302 that will be encapsulated or enclosed by the subsequently formed package structure.

Figure 2:
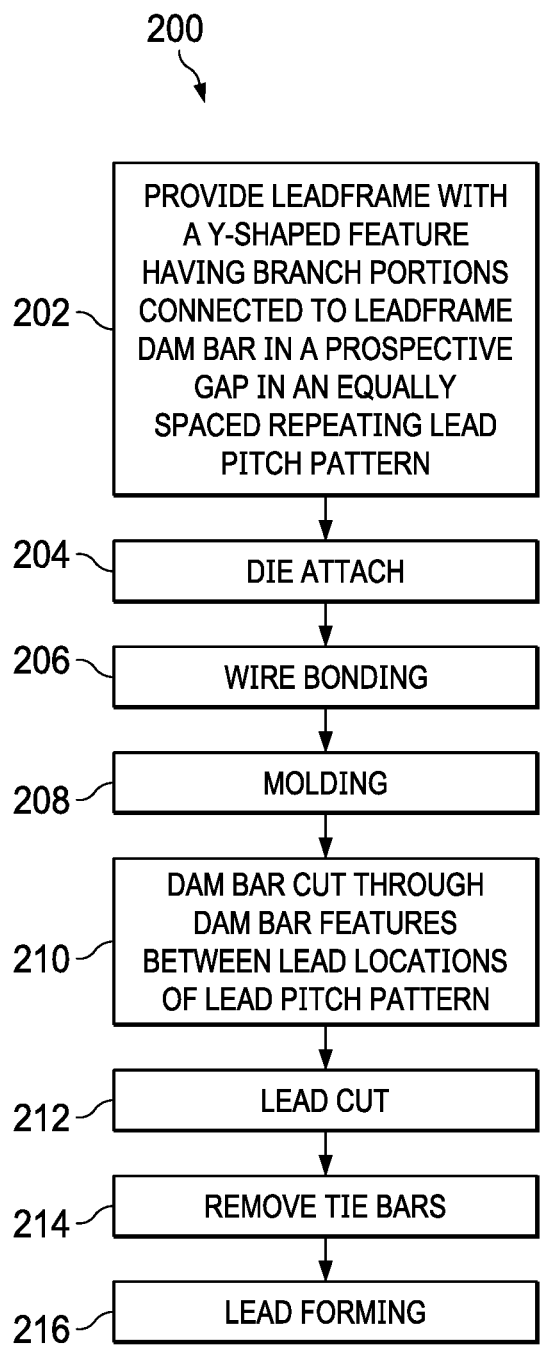
FIG. 2 is a flow diagram of a method of packaging a semiconductor device.

The method 200 continues in FIG. 2 with die attach processing at 204. FIG. 3 shows one example in which a die 303 (e.g., a semiconductor chip singulated or separated from a starting wafer, not shown) is attached to the die attach pad 301 at 204 in FIG. 2. In other examples, multiple dies can be attached to corresponding die attach pads, and other circuit components can be similarly attached to corresponding die attach pads, such as laminated magnetic circuit components (not shown). The die attachment at 204 can be performed using any suitable adhesive attachment materials, soldering, etc.

The example lead frame 300 also includes tie bars 304 that extend along the Y direction. The tie bars 304 in this example define laterally outward boundaries of the individual sections of the multi-section lead frame 300 along the X direction. The tie bars 304 are spaced along the X direction by a spacing distance 305 from dam bars 306. The dam bars 306 extend along the Y direction in FIG. 3 and provide structural support during fabrication processing. The dam bars 306 intersect the first and second portions 302, 308 of the first leads 308, 302. During manufacturing, the dam bars 306 performing a dam feature during molding of the package structure 102, to prevent molding material from reflowing laterally outward along the X direction. Following the molding operation, portions of the dam bars 306 are cut or otherwise removed from the electronic device 100. During this dam bar cut operation (e.g., at 210 in FIG. 2), trim and form tooling removes select portions of the dam bars 306 throughout a lateral dam bar cut with dimension 307 shown in FIG. 3.

The method 200 continues at 206 in FIG. 2 with wire bonding. FIG. 3 shows one example where electrical connections are made by bond wires between the semiconductor die 303 and the first portions 302 of the first leads. The planar starting lead frame 300 includes unformed (e.g., planar or flat) second portions 308 of the first leads, which are connected to the prospective internal first portions 302 as shown in FIGS. 3 and 4. The semiconductor die 303 is electrically connected to one or more of the first portions 302 of the first leads by bond wires 309. The bond wires 309 each include a first end connected (e.g., soldered) to a corresponding conductive bond pad 311 of the semiconductor die 303, as well as a second end connected e.g., soldered) to the first portion 302 of one of the first leads.

The lead frame 300 also includes one or more Y-shaped features 310. The Y-shaped features 310 are located in prospective lead gap regions. FIG. 3 shows two example Y-shaped features 310 corresponding to the gaps 110 in the electronic device 100 of FIG. 1 above. FIG. 3 shows one example section of the multi-section lead frame 300, where the illustrated section has a Y direction length dimension 312, and a lateral X direction dimension 314. The Y-shaped features 310 are connected to the dam bars 306 laterally outward of the second portions 112 of the second leads described above in connection with FIG. 1. The second leads each include a prospective internal first portion 313 shown in FIG. 3, which will eventually be encapsulated by the molded package structure 102. In the illustrated example, the first portions 313 of the second leads are soldered by corresponding bond wires 309 to die pads of the semiconductor die 303, although not a strict requirement of all possible implementations. In other examples, the internal first portions 313 of the second leads are not electrically connected to the semiconductor die 303.

As best shown in FIG. 4, the example Y-shaped features 310 each include a base section 316, a crossbar section 317, and first and second end sections 318 and 319, respectively. The base sections 316 each extend parallel to the second portions 308 of the first leads 308, 302 and laterally inward from the associated tie bar 304 along the X direction toward the associated dam bar 306. The base sections 316 are spaced apart from the Y direction. The crossbar section 317 extends parallel to the Y direction between a first end (e.g., the lower end in FIG. 3) and a second (e.g., upper) end. The first end section 318 extends parallel to the second portions 308 of the first leads 308, 302 along the X direction between the first end of the crossbar section 317 and the dam bar 306. The second end section 319 extends parallel to the second portions 308 of the first leads 308, 302 along the X direction between the second end of the crossbar section 317 and the dam bar 306. The first and second end sections 318 and 319 are respectively positioned at lead locations of the repeating lead pitch pattern.

FIG. 4 further illustrates dimensional attributes of the example lead frame 300. In this example, the first leads, including first and second portions 308 and 302, respectively, are spaced apart from one another along the Y direction by a pitch spacing distance 400 (e.g., corresponding to the spacing distance 114 in FIG. 1 above). In this example, moreover, the first and second end sections 318 and 319 of the illustrated Y-shaped feature 310 are spaced from one another along the Y direction by a spacing distance 402. In one example, the distances 400 and 402 are substantially equal, although not a strict requirement of all possible implementations. FIG. 4 also illustrates a Y-direction spacing distance 404 between the center of the adjacent first lead 308, 302 and the second end section 319. In one example, the spacing distance 404 is equal to the other spacing distance is 400 and 402, although not a strict requirement of all possible implementations. In the illustrated example, the equal spacing distances 400, 402 and 404 position the end sections 318 and 319 of the Y-shaped feature 310 at the skipped or omitted lead locations of the repeating lead pitch pattern.

Following molding, the trim and form equipment selectively removes copper material from the lead frame 300 along the dam bar 306 in the dashed line regions 406 shown in FIG. 4. The centers of the prospective material removal locations 406 are spaced from one another by a distance 408 along the Y direction. In one example, the dimension 408 is equal to the lead pitch dimension 402, allowing the trim and form tools to be used on standard devices with no omitted or skipped leads. The locations 406 correspond to the removal dimension 307 along the X direction discussed above and are located along the Y direction between successive lead locations of the repeating lead pitch pattern. As a result, the subsequent dam cut processing separates the second portion 112 of the second lead from the Y-shaped feature 310. As discussed further below in connection with FIGS. 6-9, this feature advantageously avoids or mitigates unattached copper portions from contaminating the trim and form equipment during the dam bar cut processing, while facilitating gaps in a repeating lead pitch pattern to meet any required lead spacing specifications for a given electronic device design.

The lead frame 300 in FIGS. 3 and 4 has a first subset of the first leads 308, 302 positioned along the first side 104 of the package structure 102 in a first repeating lead pitch pattern at lead locations equally spaced apart from one another along the Y direction. The lead frame 300 also includes a second subset of the first leads 308, 302 positioned along the second side 106 of the package structure 102 in a second repeating lead pitch pattern at lead locations equally spaced apart from one another along the Y direction. In addition, the second portion 112 of the second lead 112, 313 is exposed to the exterior of the package structure 102 along the first side 104 as shown in FIG. 1. The second portion 112 of the second lead 112, 313 is spaced apart from the second portions 308 of the first subset of the first leads 308, 302 along the Y direction, and the second portion 112 of the second lead 112, 313 is spaced apart from the lead locations of the first repeating lead pitch pattern along the Y direction. In the illustrated two-sided example, moreover, the lead frame 300 further includes a third lead 112, 313 on the second side 106. The third lead 112, 313 includes a first portion 313, and a second portion 112, where the second portion 112 of the third lead 112, 313 exposed to the exterior of the package structure 102 along the second side 106 In this example, the second portion 112 of the third lead 112, 313 is spaced apart from the second portions 308 of the second subset of the first leads 308, 302 along the Y direction, and the second portion 112 of the third lead 112, 313 spaced apart from the lead locations of the second repeating lead pitch pattern along the Y direction. In the example of FIGS. 1-4, the second portion 112 of the second lead 112, 313 is equally spaced apart from two adjacent lead locations of the first repeating lead pitch pattern along the Y direction, and the second portion 112 of the third lead 112, 313 is equally spaced apart from two adjacent lead locations of the second repeating lead pitch pattern along the Y direction.

Figure 5:
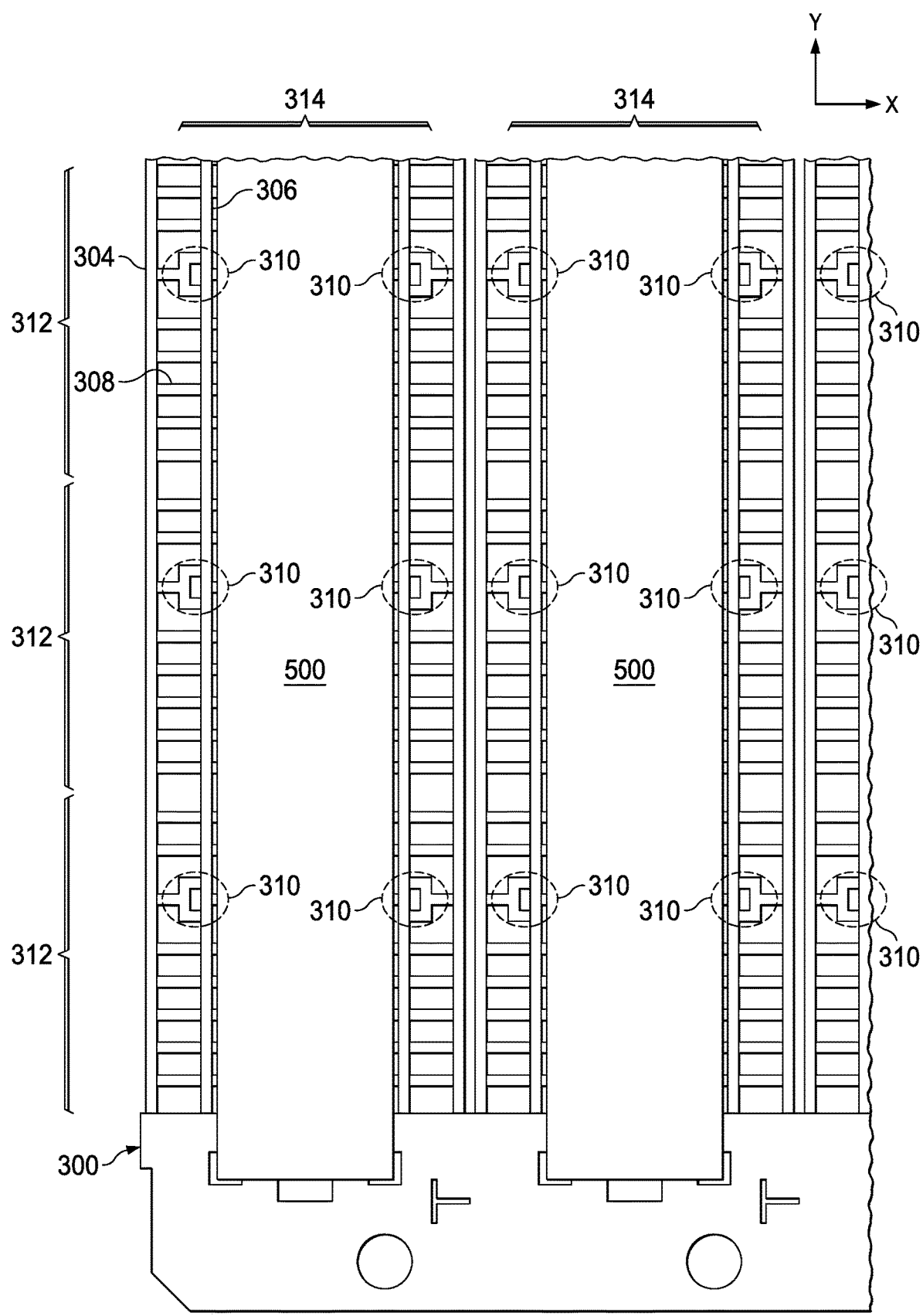
FIG. 5 is a partial top elevation view of the lead frame after molding to enclose portions of the first leads, the die attach pad, and a portion of the semiconductor die in a molded package structure.

Referring also to FIG. 5, the method 200 continues at 208 in FIG. 2 with enclosing the first portions 302 of the first leads 308, 302, the die attach pad 301, and at least a portion of the semiconductor die 303 in the package structure 102 of FIG. 1. FIG. 5 shows a top view of several sections of the example lead frame 300 after a molding operation forms plastic molded material 500 that encloses or encapsulates the first portions 302 of the first leads 308, 302, the die attach pad 301, and at least a portion of the semiconductor die 303 for each of the illustrated sections of the multi-section lead frame 300. In this example, the molded material 500 extends throughout all the sections 314 in each entire column along the Y direction to facilitate use of a single molding tool. In one example, the molding tool include upper and lower metal plates that are brought together to form a mold cavity along with the dam bars 306. Melted plastic or other mold material is injected to fill the mold cavity, and the dam bars 306 form lateral dams of the cavity that prevent molding material from reflowing laterally outward along the X direction.

Figure 6:
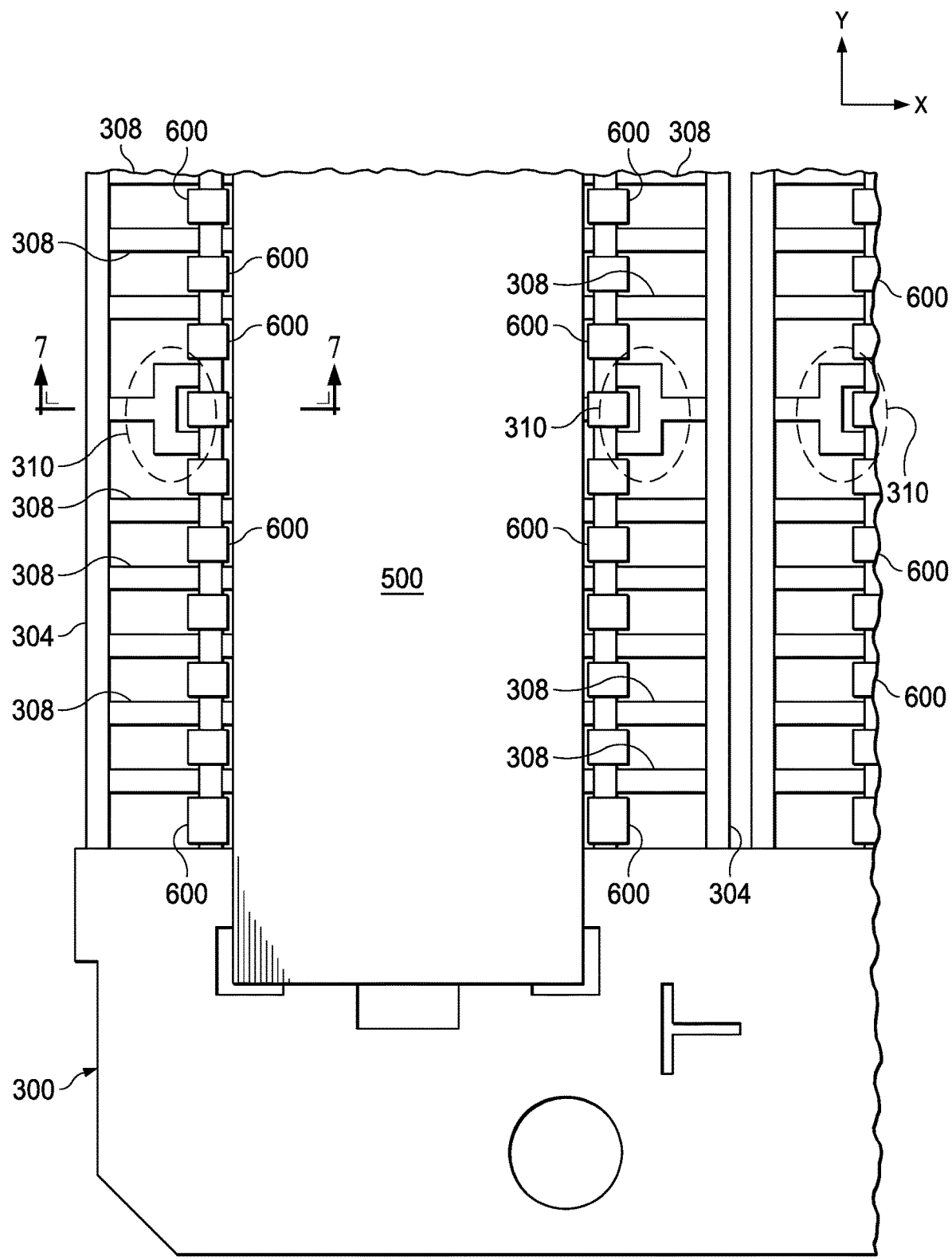
FIG. 6 is a partial top plan view of the lead frame undergoing a dam bar cut process.
Figure 7:
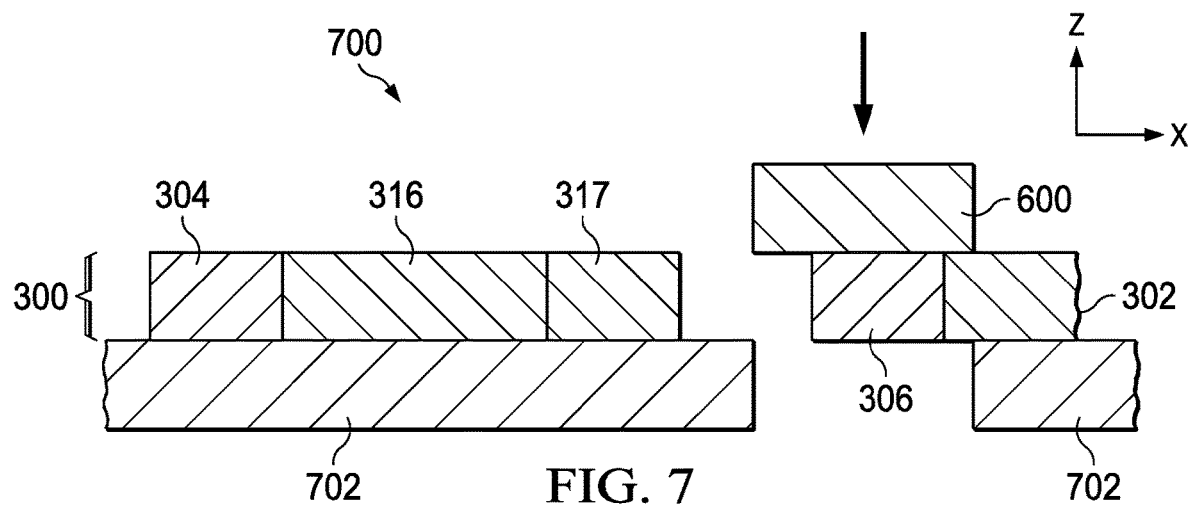
FIG. 7 is a partial sectional end elevation view taken along line 7-7 of FIG. 6 showing the dam bar cut process using a punch in a first position.
Figure 8:
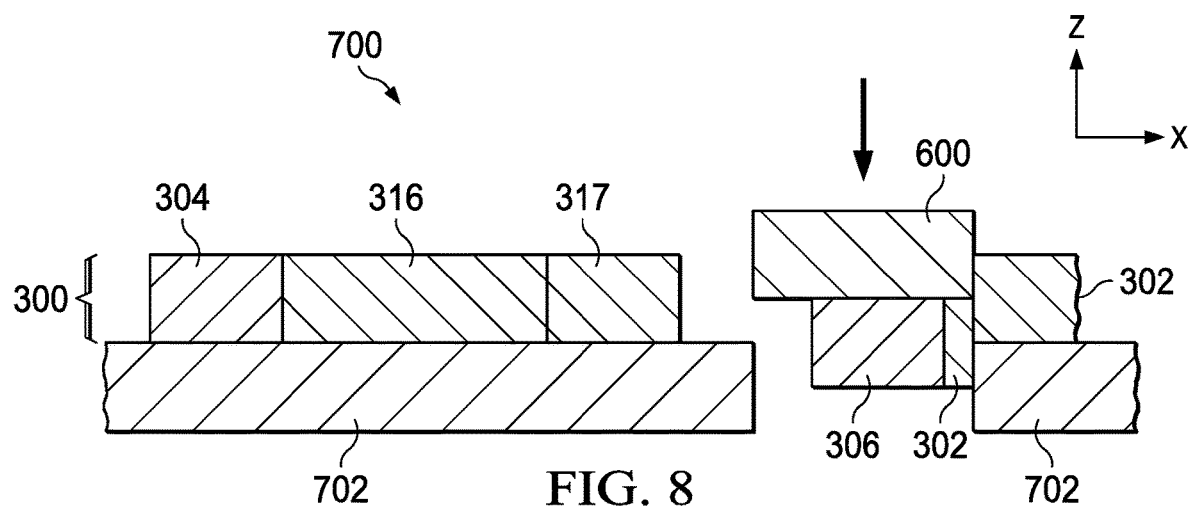
FIG. 8 is a partial sectional end elevation view taken along line 7-7 of FIG. 6 showing the dam bar cut process with the punch in a second position to a lead frame dam bar between lead locations of a repeating lead pitch pattern.
Figure 9:
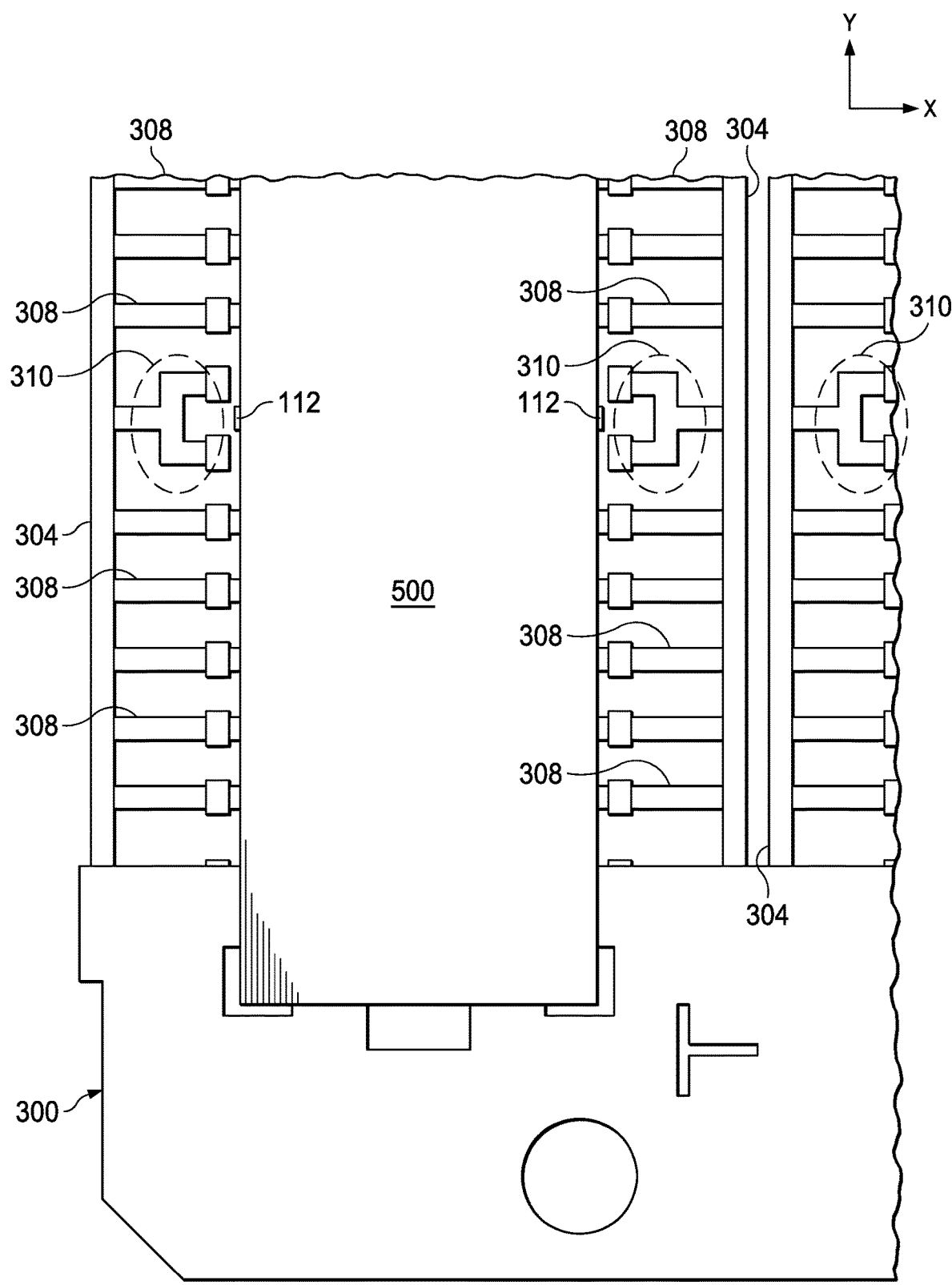
FIG. 9 is a partial top plan view of the lead frame after the dam bar cut process.

Referring also to FIGS. 2 and 6-9, the method 200 continues at 210 with dam bar cutting operations to cut through the dam bar features between the lead locations of the repeating lead pitch pattern (e.g., in locations 406 of FIG. 4 above). FIG. 6 shows a top view of the lead frame 300 undergoing a dam bar cut process, and FIGS. 7 and 8 show side views of a portion of the lead frame 300 along line 7-7 of FIG. 6 during the dam bar cut process 700. The trim and form tooling in this example includes a punch structure 600 with moving punch sections 600 shown in the top view of FIG. 6 at the removal locations 406 of FIG. 4. As shown in FIGS. 7 and 8, the tooling also includes a mechanical die 702 with openings corresponding to the removal locations 406 and the die sections 600. The example punch section 600 is shown in FIG. 7 in a first position. The punch sections 600 move downward (e.g., along the negative Z direction) to a second position in FIG. 8 and cut the engaged portions of the dam bar 306 and the first portions 302 of the first leads. FIG. 9 shows the result of the dam bar cut processing at 210.

Figure 10:
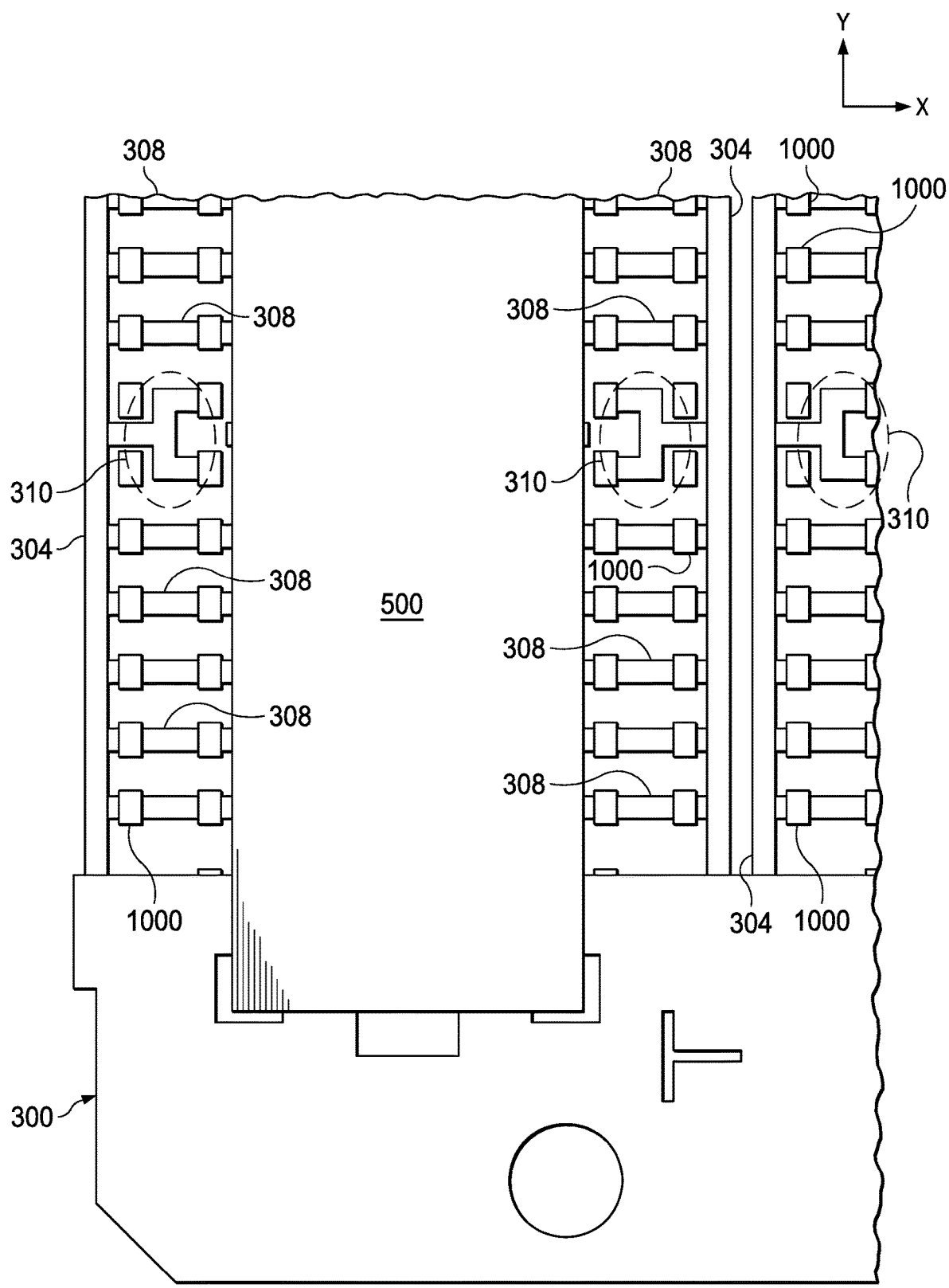
FIG. 10 is a partial top plan view of the lead frame undergoing a lead cut process that cuts ends of the first leads.
Figure 11:
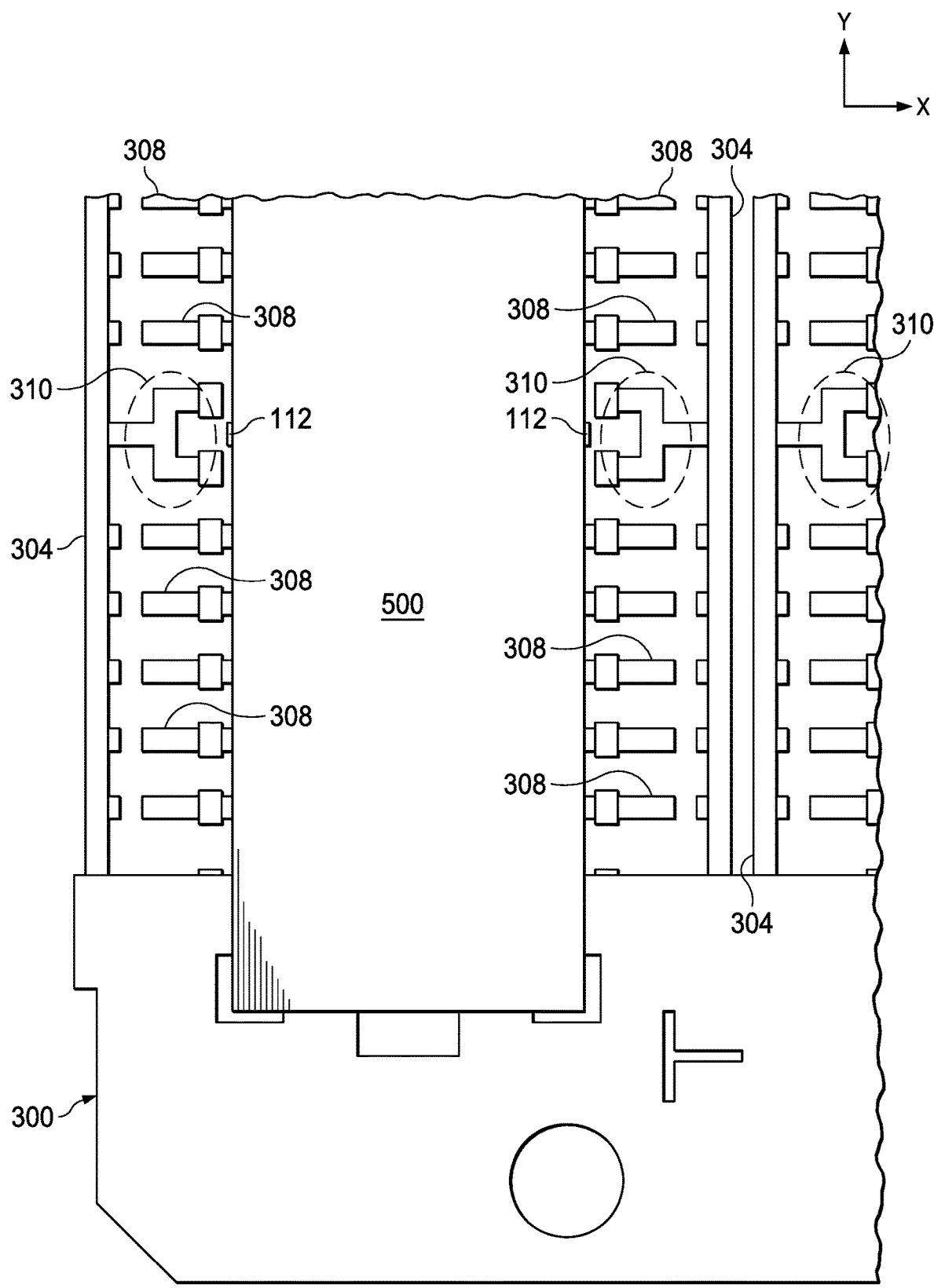
FIG. 11 is a partial top plan view of the lead frame after the lead cut process.
Figure 12:
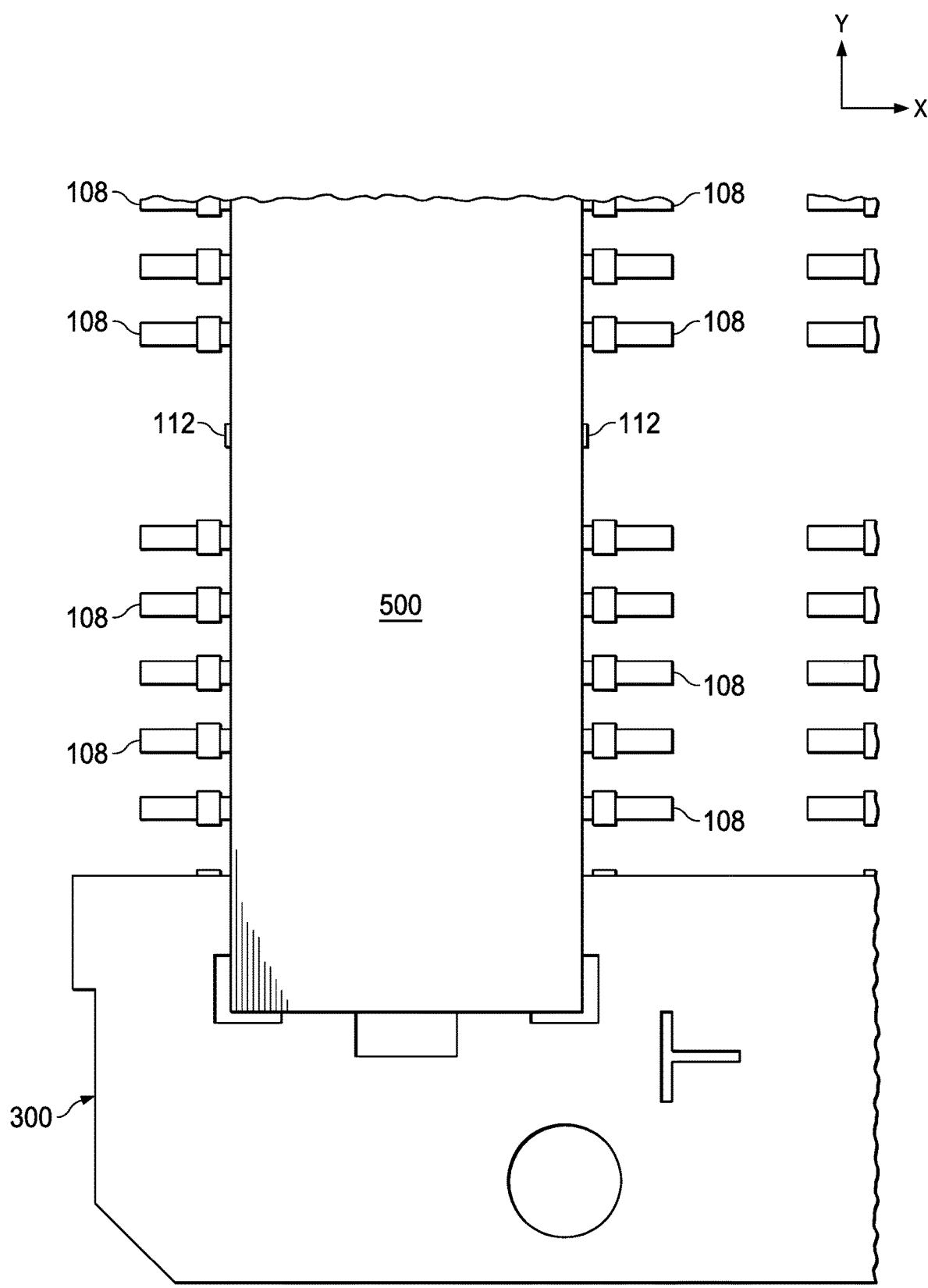
FIG. 12 is a partial top plan view of the lead frame undergoing lead formation after removal of tie bars and remaining portions of the Y-shaped features.

Referring also to FIGS. 10 and 11, the method 200 continues at 212 with a lead cut process that cuts ends of second portions 108 of the first leads 108, 302. FIG. 10 shows a top view of one example, in which the ends of the first leads are trimmed, for example, using a punch with punch sections 1000, leaving the remaining structure as shown in FIG. 11. After performing the lead cut process, the method continues with removing the tie bars 304 from the lead frame 300 at 214 as shown in FIG. 12. Thereafter at 216, the second portions 108 of the first leads 108, 302 are formed into non-planar shapes (e.g., using suitable tooling, not shown). In one example, the lead portions 108 are formed into gull wing shapes as seen in FIG. 1. Other shapes can be formed in other examples, such as J leads, etc.

Figure 13:
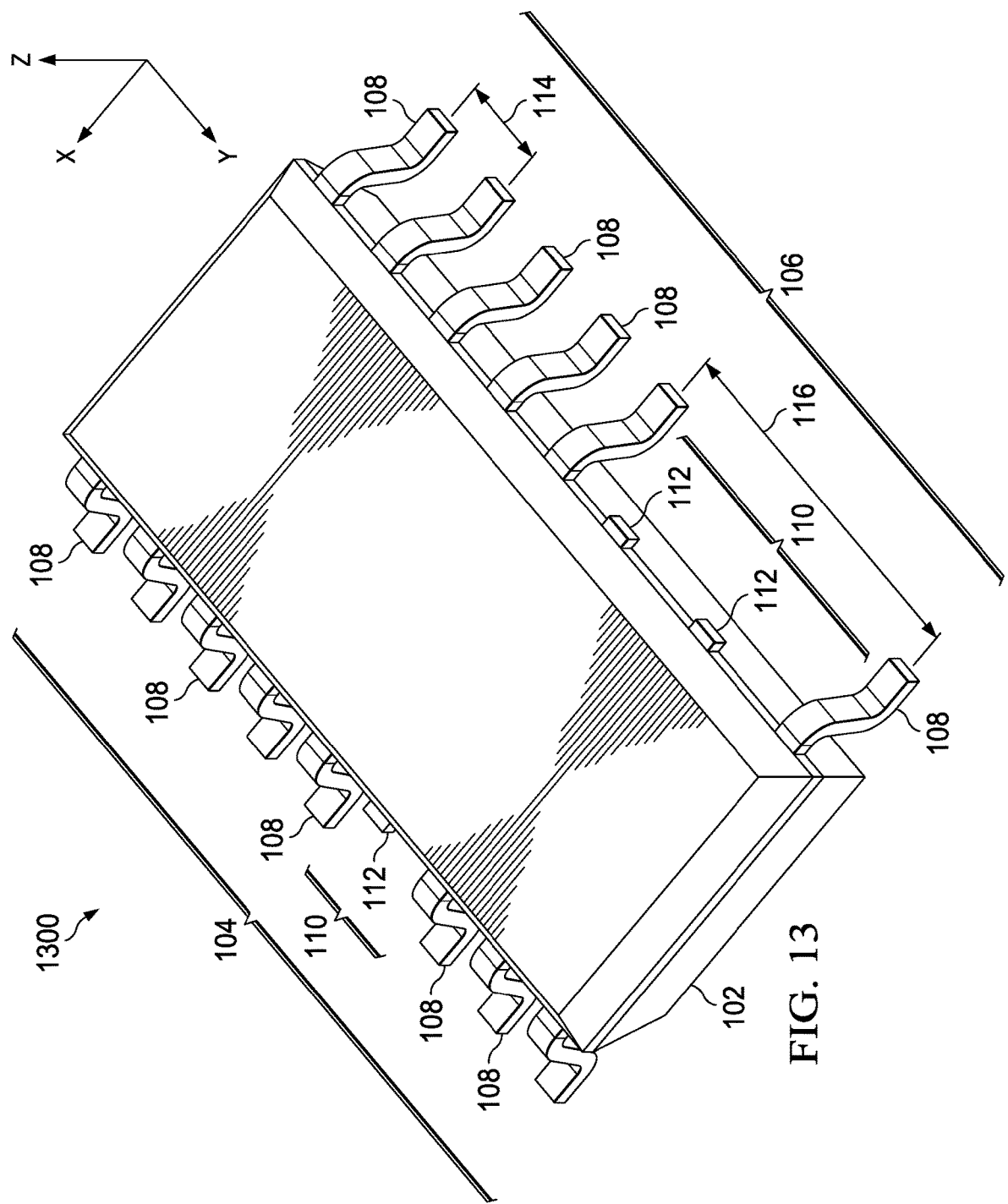
FIG. 13 is a top perspective view of another semiconductor device with a lead pitch pattern gap with four formed leads omitted from each side of a two-sided structure.

Referring now to FIGS. 1 and 13, the example electronic device 100 in FIG. 1 includes the second portions 112 of the second leads 112, 313 in a centered position, equally spaced apart from two adjacent lead locations of the repeating lead pitch pattern along the Y direction, although not a strict requirement of all possible implementations. In the example device 100 of FIGS. 1-12, the first and second sides 104, 106 are opposite sides of the package structure 102, although not a strict requirement of all possible implementations. In the device 100 of FIG. 1, moreover, the gaps 110 in the repeating lead pitch patterns each include two lead locations, although not a strict requirement of all possible implementations. FIG. 13 shows another electronic device 1300 that has a lead pitch pattern gap with four formed leads omitted from each side. In one example, the device 1300 is fabricated as described above, with the inclusion of two Y-shaped features (e.g., 110 in FIG. 3) on each side 104, 106 of the beginning lead frame. As noted above, the same uniformly spaced die segments 600 can be used in the trimming and forming tooling in order to perform the dam bar cutting operation, with the resulting structure having second portions 112 partially exposed through the package structure 102 for each of the Y-shaped features 110 included in the starting lead frame. This allows easy fabrication of the device 1300 in FIG. 13, in which the gaps 110 in the repeating lead pitch pattern include more than two lead locations.

Modifications are possible in the described embodiments, and other embodiments are possible, within the scope of the claims.

The following is claimed:
1. An electronic device, comprising:
    a set of first leads, each of the first leads including a first portion, and a second portion, the second portions of the first leads extending parallel to one another along a first direction, the second portions of the first leads positioned in a repeating lead pitch pattern at lead locations equally spaced apart from one another along a second direction, the second direction perpendicular to the first direction, and the second portions of the first leads having a formed non-planar shape;

a second lead, including a first portion, and a second portion, the second portion of the second lead spaced apart from the second portions of the first leads in a gap in the repeating lead pitch pattern along the second direction, and the second portion of the second lead spaced apart from the lead locations of the repeating lead pitch pattern along the second direction, wherein the gap in the repeating lead pitch pattern includes more than two lead locations;

a semiconductor die, including an electronic component, and a bond pad electrically connected to a terminal of the electronic component;

a bond wire with a first end connected to the bond pad, and a second end connected to the first portion of one of the first leads; and a package structure that encloses the first portions of the first leads, the first portion of the second lead, and a portion of the semiconductor die, the second portions of the first leads extending outward from the package structure, and the second portion of the second lead having an end that is exposed to an exterior of the package structure.

2. A method, comprising:

providing a lead frame with a Y-shaped feature having branch portions connected to a dam bar in a prospective gap in an equally spaced repeating lead pitch pattern, and a set of first leads extending parallel to one another along a first direction and spaced apart from one another along a second direction in lead locations of the repeating lead pitch pattern;

attaching a semiconductor die to a die attach pad of the lead frame;

attaching bond wires between bond pads of the semiconductor die, and at least some of the first leads of the lead frame;

enclosing first portions of the first leads, the die attach pad, and a portion of the semiconductor die in a package structure;

performing a dam bar cut process that cuts through portions of the dam bar between the lead locations of the repeating lead pitch pattern; and performing a lead cut process that cuts ends of second portions of the first leads.

3. The method of claim 2, further comprising removing tie bars from the lead frame after performing the lead cut process.

4. The method of claim 3, further comprising forming the second portions of the first leads into non-planar shapes after removing the tie bars from the lead frame.

5. The method of claim 3, wherein the dam bar cut process is a punch process using a punch that removes the portions of the dam bar between the lead locations of the repeating lead pitch pattern.

6. The method of claim 2, further comprising forming the second portions of the first leads into non-planar shapes after performing the lead cut process.

7. The method of claim 6, wherein forming the second portions of the first leads into non-planar shapes includes forming the second portions of the first leads into non-planar gull wing shapes.

8. The method of claim 2, wherein the dam bar cut process is a punch process using a punch that removes the portions of the dam bar between the lead locations of the repeating lead pitch pattern.

9. The method of claim 2, wherein the Y-shaped feature is not purposed as a lead.

10. A lead frame, comprising:

a die attach pad;

a set of first leads, each of the first leads including a first portion, and a second portion, the second portions of the first leads extending parallel to one another along a first direction, the second portions of the first leads positioned in a repeating lead pitch pattern at lead locations equally spaced apart from one another along a second direction, the second direction perpendicular to the first direction, and the second portions of the first leads having a formed non-planar shape;

a dam bar extending along the second direction, and intersecting the first and second portions of the first leads; and a second lead, including a first portion, a second portion and a Y-shaped third portion, the second portion of the second lead spaced apart from the second portions of the first leads in a gap in the repeating lead pitch pattern along the second direction, the second portion of the second lead spaced apart from the lead locations of the repeating lead pitch pattern along the second direction, and the Y-shaped third portion including:

a base section extending parallel to the second portions of the first leads along the first direction, the base section spaced apart from the lead locations of the repeating lead pitch pattern along the second direction, a crossbar section extending parallel to the second direction between a first end and a second end, first and second end sections extending parallel to the second portions of the first leads along the first direction between a respective one of the first and second ends of the crossbar section and the dam bar, the end sections positioned at lead locations of the repeating lead pitch pattern.

11. The lead frame of claim 10, wherein the second portion of the second lead is equally spaced apart from two adjacent lead locations of the repeating lead pitch pattern along the second direction.

12. The lead frame of claim 10, wherein the gap in the repeating lead pitch pattern includes two lead locations.

13. The lead frame of claim 10, wherein the Y-shaped branch portions face toward the die attach pad.

14. The lead frame of claim 10, wherein a base portion of the Y-shaped feature is connected to a tie bar and the branch portions of the Y-shaped feature are connected to a dam bar.

15. The lead frame of claim 10, wherein the Y-shaped feature is not purposed as a lead.

16. An electronic device, comprising:

a set of first leads, each of the first leads including a first portion, and a second portion, the second portions of the first leads extending parallel to one another along a first direction, the second portions of the first leads positioned in a repeating lead pitch pattern at lead locations equally spaced apart from one another along a second direction, the second direction perpendicular to the first direction, and the second portions of the first leads having a formed non-planar shape;

a second lead, including a first portion, and a second portion, the second portion of the second lead spaced apart from the second portions of the first leads in a gap in the repeating lead pitch pattern along the second direction, and the second portion of the second lead spaced apart from the lead locations of the repeating lead pitch pattern along the second direction;

a semiconductor die, including an electronic component, and a bond pad electrically connected to a terminal of the electronic component;

a bond wire with a first end connected to the bond pad, and a second end connected to the first portion of one of the first leads; and a package structure that encloses the first portions of the first leads, the first portion of the second lead, and a portion of the semiconductor die, the second portions of the first leads extending outward from the package structure, and the second portion of the second lead having an end that is exposed to an exterior of the package structure, wherein the second lead is not electrically connected to the semiconductor die.

17. An electronic device, comprising:

a set of first leads, each of the first leads including a first portion, and a second portion, the second portions of the first leads extending parallel to one another along a first direction, the second portions of the first leads positioned in a repeating lead pitch pattern at lead locations equally spaced apart from one another along a second direction, the second direction perpendicular to the first direction, and the second portions of the first leads having a formed non-planar shape;

a second lead, including a first portion, and a second portion, the second portion of the second lead spaced apart from the second portions of the first leads in a gap in the repeating lead pitch pattern along the second direction, and the second portion of the second lead spaced apart from the lead locations of the repeating lead pitch pattern along the second direction;

a semiconductor die, including an electronic component, and a bond pad electrically connected to a terminal of the electronic component;

a bond wire with a first end connected to the bond pad, and a second end connected to the first portion of one of the first leads; and a package structure that encloses the first portions of the first leads, the first portion of the second lead, and a portion of the semiconductor die, the second portions of the first leads extending outward from the package structure, and the second portion of the second lead having an end that is exposed to an exterior of the package structure, wherein at least two formed leads are omitted from each side of a two sided lead structure of the electronic device.

18. A method, comprising:

providing a lead frame with a Y-shaped feature having branch portions connected to a dam bar in a prospective gap in an equally spaced repeating lead pitch pattern, and a set of first leads extending parallel to one another along a first direction and spaced apart from one another along a second direction in lead locations of the repeating lead pitch pattern, wherein the Y-shaped branch portions face toward the die attach pad;

attaching a semiconductor die to a die attach pad of the lead frame;

attaching bond wires between bond pads of the semiconductor die, and at least some of the first leads of the lead frame;

enclosing first portions of the first leads, the die attach pad, and a portion of the semiconductor die in a package structure;

performing a dam bar cut process that cuts through portions of the dam bar between the lead locations of the repeating lead pitch pattern; and performing a lead cut process that cuts ends of second portions of the first leads.

19. A method, comprising:

providing a lead frame with a Y-shaped feature having branch portions connected to a dam bar in a prospective gap in an equally spaced repeating lead pitch pattern, and a set of first leads extending parallel to one another along a first direction and spaced apart from one another along a second direction in lead locations of the repeating lead pitch pattern, wherein a base portion of the Y-shaped feature is connected to a tie bar and the branch portions of the Y-shaped feature are connected to a dam bar, attaching a semiconductor die to a die attach pad of the lead frame;

attaching bond wires between bond pads of the semiconductor die, and at least some of the first leads of the lead frame;

enclosing first portions of the first leads, the die attach pad, and a portion of the semiconductor die in a package structure;

performing a dam bar cut process that cuts through portions of the dam bar between the lead locations of the repeating lead pitch pattern; and performing a lead cut process that cuts ends of second portions of the first leads.

* * * * *